United States Patent
Shimomura et al.

(10) Patent No.: US 9,245,780 B2
(45) Date of Patent: Jan. 26, 2016

(54) VACUUM PROCESSING APPARATUS AND OPERATING METHOD OF THE SAME

(75) Inventors: Takahiro Shimomura, Kudamatsu (JP); Yoshifumi Ogawa, Hikari (JP); Susumu Tauchi, Shunan (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 337 days.

(21) Appl. No.: 13/592,408

(22) Filed: Aug. 23, 2012

(65) Prior Publication Data
US 2013/0142595 A1 Jun. 6, 2013

(30) Foreign Application Priority Data
Dec. 1, 2011 (JP) .................................. 2011-263193

(51) Int. Cl.
H01L 21/677 (2006.01)
H01L 21/67 (2006.01)

(52) U.S. Cl.
CPC .... *H01L 21/67161* (2013.01); *H01L 21/67184* (2013.01)

(58) Field of Classification Search
CPC ................................................ H01L 21/67184
USPC .................................................. 414/217, 939
See application file for complete search history.

(56) References Cited

U.S. PATENT DOCUMENTS

| 6,235,634 B1 * | 5/2001 | White et al. ................... 438/680 |
| 8,439,623 B2 * | 5/2013 | van der Meulen ............ 414/217 |
| 2006/0021575 A1 | 2/2006 | Ishizawa et al. |
| 2006/0245847 A1 * | 11/2006 | Haris ............................. 414/217 |
| 2011/0110752 A1 * | 5/2011 | Tauchi et al. ................. 414/217 |
| 2011/0318143 A1 * | 12/2011 | Isomura et al. ............. 414/217.1 |

FOREIGN PATENT DOCUMENTS

| JP | 6-349931 | 12/1994 |
| JP | 2000-150618 | 5/2000 |
| JP | 2004-119635 | 4/2004 |

* cited by examiner

Primary Examiner — Saul Rodriguez
Assistant Examiner — Mark Hageman
(74) Attorney, Agent, or Firm — Baker Botts L.L.P.

(57) ABSTRACT

A vacuum processing apparatus includes a row of containers of vacuum transfer chambers connected to each other behind a lock chamber, a wafer being transferred through depressurized inside of the row of the containers of the vacuum transfer containers, an intermediate chamber disposed between the containers of the vacuum transfer chambers, a plurality of processing units including processing containers respectively connected to left or right side walls of the containers of the vacuum transfer chambers and the wafer is processed therein, and a bypass chamber which constitutes a bypass path connecting the processing units, where only either the wafer which is being transferred from the lock chamber toward one of the processing units or the wafer which was processed in one of the processing units and is being transferred toward the lock chamber is transferred through the containers of the vacuum transfer chambers.

2 Claims, 2 Drawing Sheets

VACUUM PROCESSING APPARATUS AND OPERATING METHOD OF THE SAME

BACKGROUND OF THE INVENTION

The present invention relates to a vacuum processing apparatus formed by connecting a plurality of processing units which process samples in processing chambers in vacuum containers to a plurality of vacuum transfer containers through depressurized insides of which substrate-shaped samples to be processed such as semiconductor wafers are transferred.

Among processes for manufacturing semiconductor devices, there are an etching process for processing a semiconductor wafer (hereafter referred to as a wafer) which is a substrate-shaped sample using a corrosive gas, a film forming process which needs processing at a high temperature, and an ashing process for conducting ashing processing on a mask used in the etching process and removing the mask. Among these processes, there are processes in which it is necessary to conduct a specific processing on a wafer processed using a corrosive gas at a high temperature (in the range of approximately 800° C. to 1,000° C.) after the processing.

This is because, if processing is conducted at the high temperature when conducting the ashing processing, for example, a wafer immediately after the processing remains at the high temperature, and there is a case where the wafer may be damaged due to an abrupt change in the temperature or products generated during the processing and particles of the processing gas remaining which stay around the high temperature wafer exert an unfavorable influence upon materials and members around the wafer when the wafer is transferred to the outside of the processing chamber as it is. In other words, if such a wafer immediately after the processing is transferred through the same transfer path as that before the processing, there is a possibility of causing a problem that an outgas is generated by a corrosive gas which adheres to the wafer or by excessive heating due to heat brought by the wafer and adheres to the wafer or contaminates a transfer robot or a transfer chamber.

Travel of a wafer after prescribed processing and before post-processing through the same transfer path as that of an unprocessed wafer in this way causes contamination of the unprocessed wafer, the transfer chamber which constitutes the transfer path, and members such as a robot therewithin.

Against such a problem, an example in which processing chambers can easily be added to or removed from the transfer chamber via gate valves and layouts of the processing chambers can be conducted respectively arbitrarily (see, for example, JP-A-6-349931), an example in which transfer capable of suppressing occurrence of cross-contamination is conducted by using a plurality of picks with distinction to hold processed wafers (see, for example, JP-A-2004-119635), and an example in which an intermediate path chamber which has a mounting stage and which can be evacuated to vacuum is provided between transfer chambers in a plurality of processing units and a gate valve in the intermediate path chamber is opened and closed properly to transfer without direct communication between the transfer chambers so that occurrence of metal contamination is suppressed (see, for example, JP-A-2000-150618) are known.

SUMMARY OF THE INVENTION

In recent years, requirement values concerning foreign objects and metal contamination have become strict with the progress of higher densities and higher integration of semiconductor devices. In semiconductor device manufacturing apparatuses, there are also demands such as for semiconductor devices having a layered film structure and for semiconductor devices of small quantities and large varieties due to the above-described background, processing processes also become complicated, and etching gases and processing apparatuses are also diversified.

In the conventional configuration used generally in semiconductor device manufacturing apparatuses in which one common vacuum transfer chamber connected to a plurality of processing vessels is provided and unprocessed and processed wafers are transferred using transfer means such as transfer robots disposed in the common vacuum transfer chamber, these wafers are transferred through the same transfer path, and, as a result, there is a possibility that the transfer mechanism or the inside of the transfer chamber may be contaminated by influence of an outgas emitted from a processed wafer or cross-contamination may occur on a wafer before processing which waits for next processing in the transfer chamber because the transfer path is the same, thereby causing reduction of the yield of the semiconductor devices.

The present invention is intended in view of these problems and to provide a vacuum processing apparatus or an operating method for a vacuum processing apparatus which prevent reduction of the yield of processing of a sample such as a semiconductor wafer.

The objective described above is achieved by a vacuum processing apparatus and an operating method for the vacuum processing apparatus including a row of containers of vacuum transfer chambers connected to each other behind a lock chamber which is disposed behind an atmospheric transfer chamber, a wafer being transferred through depressurized inside of the row of the containers of the vacuum transfer chambers; an intermediate chamber disposed between the containers of the vacuum transfer chambers, the wafer being mounted and stored therein; a plurality of processing units including processing chambers respectively connected to left or right side walls of the containers of the vacuum transfer chambers, the wafer being processed in the processing chambers; and a bypass chamber disposed between a first processing unit and a second processing unit of the plurality of processing units which constitutes a bypass path connecting the first and second processing units, the bypass chamber including therein a robot which transfers the wafer, and a control unit which is configured to control the transfer of the wafer from the lock chamber into the first processing unit whereupon the wafer is processed, then passed to the second processing unit through the bypass chamber, whereupon the wafer is processed, and then is transferred toward the lock chamber through the containers of the vacuum transfer chambers.

Other objects, features, and advantages of the invention will become apparent from the following description of the embodiments of the invention taken in conjunction with the accompanying drawings.

DESCRIPTION OF THE EMBODIMENTS

Hereafter, embodiments of the present invention are described with reference to the drawings.

Embodiment 1

Hereafter, Embodiment 1 of the present invention is described with reference to FIG. 1.

Figure 1:
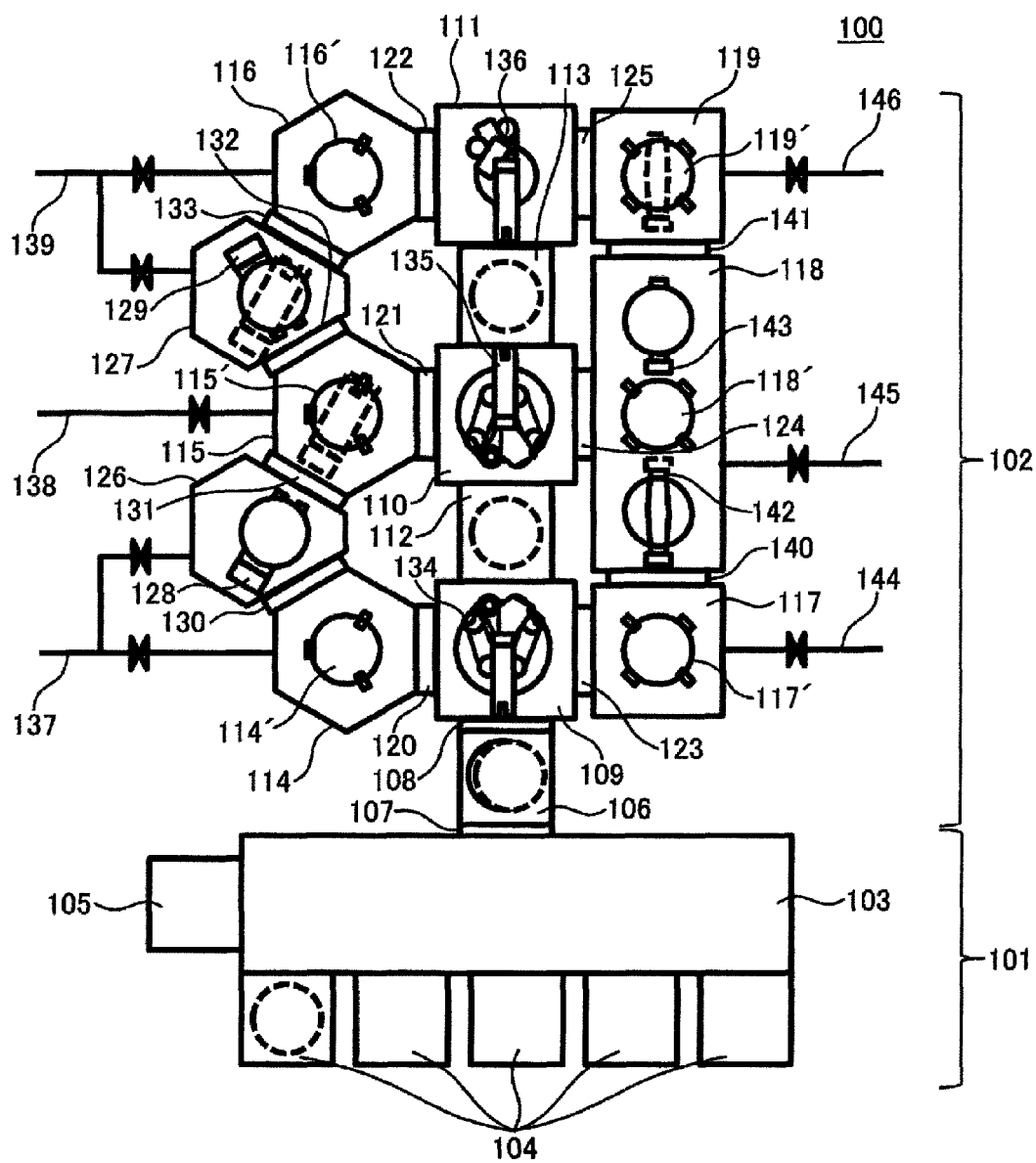
FIG. 1 is a top view showing an outline of a vacuum processing apparatus according to a first embodiment of the present invention.

FIG. 1 is a top view for explaining an outline of a configuration of a vacuum processing apparatus according to Embodiment 1 of the present invention. In the present embodiment, a vacuum processing apparatus formed by connecting a plurality of processing units for conducting ashing processing in vacuum containers to a plurality of vacuum transfer containers each having a transfer robot in its internal depressurized chamber to transfer a semiconductor wafer (hereafter referred to as a wafer) which is a substrate-shaped sample, the so-called ashing apparatus, is explained.

In FIG. 1, a vacuum processing apparatus 100 according to the present embodiment is roughly divided into two blocks disposed in front and in rear. An atmospheric side block 101 in which a wafer to be processed is transferred and handled under the atmospheric pressure or a pressure close thereto is disposed in a front part of the vacuum processing apparatus 100 shown on the lower side in the drawing. A vacuum side block 102 in which a wafer is transferred, processed, or stored with a high degree of vacuum or at a low pressure is disposed in a rear part of the vacuum processing apparatus 100 shown on the upper side in the drawing.

The atmospheric side block 101 includes an atmospheric transfer container 103 including an atmospheric transfer chamber therein to transfer an unprocessed or processed wafer in a space provided at the atmospheric pressure or a pressure which is sufficiently close to the atmospheric pressure and consequently which can be regarded as the atmospheric pressure and taking the shape of a substantially rectangular parallelepiped, and a plurality of cassette stages 104 disposed in parallel on a front face of the atmospheric transfer container (on the lower side face in the drawing) to mount and hold cassettes storing a plurality of wafers W on a top face thereof.

Furthermore, an aligner 105 is disposed on a side face of an end part of a left side in the drawing (on a left side in a horizontal direction when viewing the rear from the front side) of the atmospheric transfer container 103 to conduct position alignment to adjust a center of a wafer W or an angle and a direction position of a cutout or a notch formed on a part of an outer edge with respect to the center before processing. The vacuum side block 102 is connected behind a rear face of the atmospheric transfer container 103 and a lock chamber 106 having therein a space provided with an internal pressure which can be adjusted variably between the atmospheric pressure and the vacuum pressure is disposed between the atmospheric transfer container 103 provided with the atmospheric pressure therein and the vacuum side block 102 provided with the vacuum pressure.

An atmospheric transfer robot is disposed in the atmospheric transfer chamber within the atmospheric transfer container 103, which is a means for transferring the wafer W between the cassette or the aligner and the lock chamber 106 and a robot including a hand part disposed to hold and carry the wafer W on a tip part of an arm which includes a plurality of beam-shaped links and a plurality of joint parts to connect and rotate the links and which conducts expansion and contraction operation. A rail which is not illustrated and which extends in a lateral direction in the drawing (in the horizontal direction when viewed from the front) as far as from/to vicinities of the left and right ends of the atmospheric transfer chamber is disposed in the atmospheric transfer chamber and the plurality of cassettes mounted respectively on the plurality of cassette stages 104, the aligner 105, and the lock chamber 106 disposed on the rear face of the atmospheric transfer container 103 are disposed in a range of reach of the hand brought about by the extension and contraction of the arm at the time when transferring the wafer W with movement of the atmospheric transfer robot on and along the rail.

Incidentally, as for the lock chamber 106, only one container is shown in FIG. 1 but a plurality of containers may also be disposed. In addition, the plurality of lock chambers 106 may be disposed together in the lateral direction of the drawing (the horizontal direction), or may be disposed one over the other in the vertical direction.

Further, the lock chamber 106 has the configuration that the internal pressure can be adjusted variably between the atmospheric pressure and a depressurized pressure (low pressure or the vacuum pressure) value of a prescribed degree of vacuum as described above and has, together with a function of evacuating the internal space in a state in which the wafer W is stored in the internal space and thereby lowering the pressure from the atmospheric pressure to the vacuum pressure, a function of introducing gas into the inside and thereby raising the pressure from the vacuum pressure to the atmospheric pressure. The former is a function executed in a state in which an unprocessed wafer W is stored in a space for storing, the so-called loading, and the latter is a function executed in a state in which a processed wafer W is stored in the storing space, the so-called unloading.

In the present embodiment, only one lock chamber 106 is shown in the drawing; however, it is configured to have two containers and be capable of conducting both the loading function and the unloading function within each of the two containers as occasion demands. Furthermore, openings for putting in and out the wafer W with the atmospheric transfer chamber in the atmospheric transfer container 103 are disposed on front sides of the two containers in the lock chamber 106, respectively, and two valves for opening and blocking to hermetically seal the openings are disposed between the lock chamber 106 and the atmospheric transfer container 103.

Hereafter, the two valves for opening/closing the openings on the atmospheric side of the lock chamber 106 are referred to simply as gate valves 107. Furthermore, openings for putting in and out the wafer W with the vacuum side are disposed on the rear side of the lock chamber 106 in the same way as the atmospheric side, and two valves for opening/closing them are disposed. These valves are also referred to simply as gate valves 108.

The vacuum side block 102 is configured by connecting a plurality of vacuum containers for processing and a plurality of transfer containers for transferring the wafer W through their internal spaces, which are disposed behind the lock chamber 106 and connected to it, to each other. Processing chambers in the vacuum containers communicate with transfer chambers in the containers for transfer, and each is connected to an evacuation means such as a vacuum pump which is not illustrated to have a configuration to be evacuated internally and thereby depressurized to a predetermined pressure and kept at the pressure.

In particular, in the vacuum side block 102 according to the present embodiment, a plurality of vacuum transfer containers 109, 110, and 111, which are vacuum containers each taking the plane shape of a rectangle and in which the wafer W is transferred within a transfer chamber depressurized to a prescribed low pressure, are connected rectilinearly in a depth direction behind the lock chamber 106. A plurality of vacuum containers are connected respectively to side walls in the lateral direction in the drawing of the plurality of vacuum transfer containers 109, 110, and 111 and a processing chamber which is a space for conducting specific processing with the wafer W mounted in each of the vacuum containers is disposed. In this way, the vacuum side block 102 becomes a space for conducting handling such as processing, transferring, or holding the wafer W in the depressurized state.

Hereafter, the vacuum transfer containers 109, 110, and 111 are referred to respectively as a first vacuum transfer container 109, a second vacuum transfer container 110, and a third vacuum transfer container 111, as needed. Intermediate chamber containers 112 and 113 are disposed between these vacuum transfer containers 109, 110, and 111 to connect them, each of which is a container having a storage part for storing and disposing the wafer W in its internal intermediate chamber.

Hereafter, the two intermediate chamber containers 112 and 113 in the present embodiment are referred to as a first intermediate chamber container 112 and a second intermediate chamber container 113 as required. The first intermediate chamber container 112 connects the first vacuum transfer container 109 and the second vacuum transfer container 110 to each other between them. Also, the second intermediate chamber container 113 connects the second vacuum transfer container 110 and the third vacuum transfer container 111 to each other between them.

Each of these vacuum transfer containers 109, 110, and 111 and the intermediate chamber containers 112 and 113 in the present embodiment is a vacuum container substantially taking the shape of a cube which has a plane shape viewed from the above formed of a rectangle or a combination of lines which can be regarded approximately as a rectangle. These are connected mutually and disposed rectilinearly in a vertical direction in the drawing (the front-and-rear or depth direction of the vacuum processing apparatus 100). In addition, processing units respectively having vacuum containers are connected to side walls corresponding to sides in the lateral direction in the drawing (the horizontal direction) of the vacuum transfer containers 109, 110, and 111, respectively.

In other words, rows of the processing units respectively connected to the vacuum transfer containers 109, 110, and 111 are disposed on the right and the left of the line-shaped row of the vacuum transfer containers 109, 110, and 111 and the intermediate chamber containers 112 and 113 in the drawing. The row on the left side includes an ashing processing unit 114 connected to a left side wall of the first vacuum transfer container 109, a cooling unit 115 which is connected to a left side wall of the vacuum transfer container 110 and which cools the wafer W subjected to ashing processing therein, and an ashing processing unit 116 connected to a left side wall of the vacuum transfer container 111. In addition, the row on the right side includes an ashing processing unit 117 connected to a right side wall of the first vacuum transfer container 109, a cooling unit 118 which is connected to a right side wall of the vacuum transfer container 110 and which cools the wafer W subjected to ashing processing therein, and an ashing processing unit 119 connected to a right side wall of the vacuum transfer container 111.

Between a transfer chamber in the vacuum transfer container 109 and processing chambers in the ashing processing units 114 and 117, between a transfer chamber in the vacuum transfer container 110 and processing chambers in the cooling units 115 and 118, and between a transfer chamber in the vacuum transfer container 111 and processing chambers in the ashing processing units 116 and 119 are communicated, respectively, via gates, which are openings through which the wafer W is transferred therein. These gates are opened and closed by gate valves 120, 121, 122, 123, 124, and 125 respectively disposed within the vacuum transfer containers 109, 110, and 111 to open and block to hermetically seal the gates.

Vacuum transfer robots 134, 135, and 136 are disposed in the vacuum transfer chambers respectively disposed in the vacuum transfer containers 109, 110, and 111 to hold and transfer the wafer W between the insides of the transfer chambers and the ashing processing units 114, 116, 117, and 119 and the cooling units 115 and 118 connected to them. In the same way as the atmospheric transfer robot, each of the vacuum transfer robots 134, 135, and 136 is a robot including a hand part disposed to hold and carry the wafer W on a tip part of an arm which includes a plurality of beam-shaped links and a plurality of joint parts to connect and rotate the links and which conducts expansion and contraction operation.

Each of the vacuum transfer robots 134, 135, and 136 is disposed in a central part of the vacuum transfer chamber to be rotatable around an axis in the direction perpendicular to the plane of the drawing (the vertical direction) and is possible to oppose the extension direction of the arm to one of a plurality of gates provided in each of the vacuum transfer containers 109, 110, and 111 by rotating around the rotation axis. Furthermore, each of the vacuum transfer robots 134 and 135 in the present embodiment has a configuration in which two arms are provided and the arms can rotate and expand/contract while holding the wafer W in each of them. Such a configuration becomes convenient for conducting an interchange operation, which is composed of steps of, while holding a pre-processed (unprocessed) wafer W on a hand of a contracted arm, extending the other arm into a specific processing chamber to mount and receive a processed wafer W on the hand and contracting the other arm, and directing the former arm to the processing chamber by rotation and extending, and transferring the unprocessed wafer W into the processing chamber, in a short time.

Incidentally, since the vacuum transfer robot 136 transfers only a processed wafer W in the vacuum transfer container 111 as described later, there is no need to have two arms. In the present embodiment, therefore, the vacuum transfer robot 136 is configured to have only one arm; however, it may have a plurality of arms in the same way as other vacuum transfer robots.

In addition, in the row of the processing units on the left side, bypass containers 126 and 127 are disposed respectively between the ashing processing unit 114 and the cooling unit 115 and between the ashing processing unit 116 and the cooling unit 115 to connect them and transfer the wafer W through their internal spaces. Each of vacuum containers which constitute the ashing processing units 114 and 116 and the cooling unit 115 in the present embodiment takes a plane shape of a polygon (hexagon) when viewed from the above and the bypass containers 126 and 127 taking a plane shape of a polygon (hexagon) are disposed to be sandwiched between side walls corresponding to sides of those containers and connect those side walls.

The bypass containers 126 and 127 have spaces for transferring the wafer W inside and robot arms 128 and 129 are disposed respectively in the spaces to hold and transfer the wafer W. Also, the spaces of the bypass containers 126 and 127 and the internal processing chambers of the ashing processing units 114 and 116 and the cooling unit 115 are communicated via gates which are openings for the wafer W to pass through to be transferred.

In other words, the bypass container 126 communicates with the ashing processing unit 114 and the cooling unit 115 via gates which are openings, respectively, and the bypass container 127 communicates with the ashing processing unit 116 and the cooling unit 115 via gates which are openings, respectively. Gate valves 130, 131, 132, and 133 are disposed respectively in the gates to open and block to hermetically seal the openings.

While the wafer W is mounted and processed in the ashing processing units 114 and 116 and the cooling unit 115, the gate valves 130 to 133 block and hermetically seal the inside, and, when transferring the wafer W out from the inside or transferring the wafer W into the inside, they are driven by a driving device which is not illustrated to open the pertinent gate. As a result, in a state in which the robot arm 128 or 129 contracts its arm and holds a wafer W on its hand, transfer of another wafer W is conducted between the bypass container 126 or 127 and the ashing processing unit 114 or 116 or the cooling unit 115.

When the transfer is finished and the robot arm 128 or 129 exits from the processing chamber in the ashing processing unit 114 or 116 or the cooling unit 115, one of the gate valves which should block the corresponding processing chamber blocks to hermetically partition its inside. Incidentally, in the present embodiment, any gate valve described hereafter has the same configuration and has a driving means which moves a valve element of the valve in the direction perpendicular to the plane of the drawing (in the vertical direction). When blocking an opening, one face of the valve body is brought into contact with a wall face around the opening via a seal member such as an O-ring and consequently it is possible to cause the seal function of the seal member to be exhibited and hermetically seal the inside of the opening from the outside of the seal member and, when opening the gate opening, the opening is conducted by moving the valve body in a direction opposite to that at the time when blocking and separating the valve body together with the seal member from the wall face around the opening.

The gate valves 130 to 133 open/close communication between insides of the ashing processing unit 114, the cooling unit 115, the ashing processing unit 116, and the bypass containers 126 and 127. In addition, in the present embodiment, the opening operation is conducted in a state in which the other gates communicating with processing chambers in two processing units which communicate with the gate to be opened by the gate valve are blocked.

For example, the bypass container 126 is put between the ashing processing unit 114 and the cooling unit 115 and connected to them, and processing chambers in them communicate with a transfer space in the bypass container 126 via two gates, which are opened and closed by the gate valves 130 and 131. In this way, each of the vacuum containers in processing units and the bypass containers in the present embodiment has at least two gates, and its inside communicates with an inside of a different container and is connected thereto.

For example, the gate valve 130 is opened only in a state in which any of gates for the space in the bypass container 126 and the processing chamber in the ashing processing unit 114 which are blocked and partitioned by it except the gate between them are not opened (in a state in which the space in the bypass container 126 and the processing chamber in the ashing processing unit 114 are not opened by the other gate valves). In other words, the gate valve 130 conducts an exclusive operation of being opened only in a state in which insides of two containers blocked and partitioned by it are not opened and, in a state in which the gate valve 130 is opened, the other gate valves (the gate valves 131 and 120) which open/close gates communicating with insides of the two containers (the bypass container 126 and the vacuum container in the ashing processing unit 114) do not conduct the opening operation.

By doing so, it is prevented that spaces within two containers partitioned by a valve which is about to conduct an opening/closing operation communicate with inside of a container other than them and contamination spreads without intention. It is prevented, for example, that a processing chamber within the vacuum container of the ashing processing unit 114 immediately after ashing processing communicates with the transfer chamber in the second vacuum transfer container 110, and particles of the wafer W in a state in which it is not cooled and the particles causing foreign objects in the surroundings are not decreased intrude into the transfer chamber in the second vacuum transfer container 110 and contaminate the inside thereof, that is so-called cross contamination.

Shown in the present drawing, each of the ashing processing units 114 and 116 in the present embodiment has the vacuum container taking a plane shape of a polygon (hexagon) when viewed from the above. In processing chambers disposed within them mounting stages 114' and 116' each taking a cylindrical shape disposed in the depressurized space are disposed; in the state in which the wafer W is transferred and mounted thereon and a gas for processing is supplied into the space in the processing chamber through a gas supply path which is not illustrated and which is connected to the vacuum container to bring about a prescribed degree of vacuum, an electric field having a predetermined frequency is supplied into the processing chamber to form plasma.

A film to be processed such as a mask disposed on the surface of the wafer W which is held on the mounting stage 114' or 116' is subjected to ashing processing using the plasma. Incidentally, in the present embodiment, the pressure (the degree of vacuum) in the processing chamber at the time of the ashing processing is set to become 500 Pa.

When a control part in the vacuum processing apparatus 100 which is not illustrated detects that the ashing processing for a predetermined time is finished in the ashing processing unit 114 or 116, then the supply of the electric field and the processing gas is stopped and the plasma in the processing chamber disappears. Thereafter, an inert gas (for example, nitrogen gas) is supplied into the processing chamber and the processing gas is evacuated from the processing chamber so that replacement of gas is conducted in the processing chamber and a pressure used for transferring of the wafer W to the outside of the processing chamber is set.

Over each of the mounting stages 114' and 116' of the present embodiment, the wafer W at an unprocessed condition is held in a state in which it is lifted over a mounting surface of the top face of the mounting stages 114' and 116' with a prescribed gap by three pins and a surface which is a face to be processed is horizontal or has an angle which can be regarded as horizontal. Especially in the present embodiment, pins are disposed in positions where positions of equal angles of a substantially circular outer periphery of the wafer W come in contact with tip parts of the pins in a state in which the wafer W is mounted on the pins and it is prevented that a result of processing in a local low temperature part generated by heat transfer from a pin contact part in an inner side part in a face direction of the wafer W where the film to be processed exists becomes different from that in other places.

When it is detected that the inside of the processing chamber has reached a pressure (for example, 100 Pa) suitable for transfer, the gate valves 130 and 133 which hermetically partition the ashing processing units 114 and 116 from the bypass containers 126 and 127 connected to them are opened, and the ashing processing units 114 and 116 communicate with the bypass containers 126 and 127, respectively. Each of the robot arms 128 and 129 disposed respectively in the bypass containers 126 or 127 extends or moves its arm, enters between the top face of the mounting stage 114' or 116' in the processing chamber in the ashing processing unit 114 or 116 communicated with the bypass container via the gate and the wafer W lifted over by the pins, receives the wafer W on the arm, contracts or moves the arm, and stores the wafer W at a high temperature after the ashing processing into a storage part in the bypass container 126 or 127.

The bypass containers 126 and 127 are disposed to connect the ashing processing units 114 and 116 to the cooling unit 115. The storage parts inside communicate with the processing chambers in the ashing processing units 114 and 116 via gates, respectively. The robot arms 128 and 129 are disposed in the storage parts in the bypass containers 126 and 127 to conduct operations of mounting and receiving the wafer W on the arm in the ashing processing units 114 and 116 and of transferring the wafer W into the processing chamber in the cooling unit 115 to hand over to a mounting stage 115'.

The bypass container 126 or 127 in the present embodiment is a vacuum container taking a plane shape of a polygon (hexagon) when viewed from the above and side faces corresponding to two sides of the hexagon are opposed to and connected to side walls of the ashing processing unit 114 or 116 and the cooling unit 115 in positions sandwiched between them. The storage parts in the bypass containers 126 and 127 are connected to the processing chamber in the cooling unit 115 via gates, each of which has a section taking the shape of an oblong rectangle or a rectangle with its corners rounded within which, as described above, the wafer W mounted on the arm is transferred, and the gate valves 131 and 132 are disposed to open and hermetically block those gates.

The robot arms 128 and 129 disposed respectively in the storage parts in the bypass containers 126 and 127 are disposed in nearly central parts in the storage parts as being capable to rotate around axes in the direction perpendicular to the plane of the drawing (in the vertical direction), respectively. Each of the robot arms 128 and 129 can rotate around the rotation axis with its arm contracted and direct the extension direction of the arm to a gate defined by the gate valve 130, 131, 132 or 133

For example, the robot arm 128 rotates around the rotation axis to oppose the extension direction of the arm to a gate, extends or moves the arm into the processing chamber in the ashing processing unit 114 through the gate opened by the gate valve 130, makes the arm enter under the wafer W held on the pins over the mounting stage 114', and holds it. Then, the pins descend down and consequently the wafer W is mounted on the arm and handed over and, thereafter, the arm is contracted or moved to exit from the processing chamber in the ashing processing unit 114 with the wafer W mounted thereon; in other words, the wafer is transferred out.

When it is detected that the arm is contracted or moved and the arm and the wafer W are stored in the storage part in the bypass container 126, the gate valve 130 is blocked in response to a command from the control part and the robot arm 128 with the wafer W held thereon rotates around the rotation axis, moves the direction of the extension and the movement of the arm to a position opposing to the gate between the bypass container 126 and the cooling unit 115, and stops the rotation.

When the gate valve 131 which partitions between the cooling unit 115 and the bypass container 126 operates to open the gate in response to a command signal from the control part, the robot arm 128 moves the arm in response to a command signal from the control part to move the wafer W over the mounting stage 115' in the cooling unit 115 and hands it over onto the pins, i.e., transfers the wafer W in.

When the robot arm 128 which has delivered the wafer W over the mounting stage 115' moves the arm and exits from the cooling unit 115 and the gate, the gate valve 131 is closed and the inside of the processing chamber in the cooling unit 115 is hermetically sealed. When blocking of the gate is detected, the wafer W is cooled in the cooling unit 115 in response to a command signal from the control part.

In the cooling unit 115, while the outer periphery of the wafer W is held on tips of three pins over a top face of the mounting stage 115' which is adjusted to a prescribed temperature with a space between, by letting a thermally conductive gas such as He gas, for example, flow inside and causing heat exchange between the mounting stage 115' and the gas, the temperature of the wafer W is lowered to perform cooling. In the present embodiment, in a state in which the thermally conductive gas is supplied while evacuating the inside of the processing chamber, the pressure in the processing chamber in the cooling unit 115 is set equal to 1,000 Pa.

Each of the robot arms 128 and 129 has a multi-joint arm including a plurality of beam-shaped link parts and a plurality of joint parts to connect and rotate their end parts and, furthermore, a hand capable of holding the wafer W within a concave part is disposed in a tip part of an arm located at an end in the connected link part. Each of the robot arms 128 and 129 extends the arm and moves the hand by driving and rotating the joint parts in response to a command signal from the control part and, when a wafer W is mounted, each of the robot arms 128 and 129 can move the wafer W.

In the present embodiment, with the arm extended the wafer W is received from the mounting stage 114' or 116' onto the hand, and is handed over from the hand to the mounting stage 115'.

In other words, in a state in which the wafer W is mounted on the hand and the arm is extended at its maximum, each of the robot arms 128 and 129 can move to a position where a center of the wafer W (or a position of a wafer holding part of the hand which is set to coincide with the center of the wafer W) coincides with a center of the mounting stage 114', 115', or 116' or a position located beyond it.

Each of the mounting stages 114', 115', and 116' in the present embodiment has three pins which hold the wafer W at their tips in contact with the outer periphery of the wafer W. Each of the pins is disposed in a through hole communicating with an opening disposed in a top face which is a mounting surface of the mounting stage and driven by a driving means which is not illustrated to move up and down in a direction of an axis of the through hole (the vertical direction). Furthermore, axes of the three through holes are disposed at equal angles, i.e., 120 degrees on a circumference having the same shape as the wafer W from a center of the mounting surface which is substantially circular.

Two out of the three respective pins are disposed at equal distances with respect to a plurality of gates communicating with the processing chamber in which each of the mounting stages 114', 115', and 116' is stored. As a result, it is configured that the gap between the arm and a pin is made large when an arm of the robot arm 128 or 129 or the vacuum transfer robot 134 to 136 extends and enters between the pins.

In addition, as for arrangement on the plane in the present embodiment when viewed from the above, a line connecting the center of the mounting surface of the mounting stage 114' and the rotation center axis of the robot arm 128 and a line connecting the rotation center axis of the robot arm 128 and the center of the mounting surface of the mounting stage 115' form 120 degrees or an angle close to 120 degrees enough to be regarded as 120 degrees. In the same way, a line connecting the center of the mounting surface of the mounting stage 115' and the rotation center axis of the robot arm 129 and a line connecting the rotation center axis of the robot arm 129 and the center of the mounting surface of the mounting stage 116' form 120 degrees or an angle close to 120 degrees enough to be regarded as 120 degrees.

And the bypass containers 126 and 127 are configured between side walls of the vacuum containers of the ashing processing units 114 and 116 and the side walls of the cooling unit 115 with side walls opposed to them forming an angle of 60 degrees. In the present embodiment, therefore, centers of the ashing processing units 114 and 116 and the cooling unit 115 are connected in the depth direction from the front toward the rear in zigzags.

The centers of the mounting surfaces of the mounting stages 114' and 116' disposed in center parts of the processing chambers in the vacuum containers of the ashing processing units 114 and 116 in the present embodiment are disposed coaxially with centers of the hexagonal vacuum containers. In addition, lines connecting the center of the mounting stage 114' and rotation axes of the vacuum transfer robot 134 in the vacuum transfer container 109 and the robot arm 128 in the bypass container 126 are along movement directions of the hands in contraction operations of the arm of the vacuum transfer robot 134 and the robot arm 128, respectively, and two of the pins of the mounting stage 114' are disposed at equal distances from each of the lines.

Furthermore, centers of sectional shapes of oblong gates opened and closed by the gate valves 120 and 130 in the height direction and the horizontal direction are disposed to coincide with those lines. In other words, the gates are disposed respectively to coincide with the axes on which the hand parts of the vacuum transfer robot 134 and the robot arm 128 which are transfer means move. Such a configuration is the same with respect to relative positions among the cooling unit 115, the ashing processing unit 116, and the vacuum transfer containers 110 and 111, and relative positions among the cooling unit 115, the ashing processing unit 116, and the bypass container 127, as well.

In the above embodiment, the vacuum transfer robots 134 to 136 and the robot arms 128 and 129 conduct the movements of the hand parts of the arms along the lines rectilinearly.

The vacuum transfer containers 109 to 111 and the intermediate chamber containers 112 and 113 disposed therebetween are connected in the front-and-rear direction, and connected containers communicate with each other via a gate having an opening which is a passage of the wafer W. These gates are disposed in a row in the up-and-down direction in the drawing (the front-and-rear direction), and centers of the gates in the horizontal direction and the height direction are located on a straight line, which coincides with a line connecting rotation axes of the vacuum transfer robots 134, 135, and 136 when viewed from the above. In other words, gates and their openings communicating with the vacuum transfer containers 109 to 111 and the intermediate chamber containers 112 and 113 are disposed to coincide with the movement direction of the hand parts of the arms of the vacuum transfer robots 134 to 136.

Positions of such arrangements are also true for the gates between the ashing processing units 114 and 116 and the cooling unit 115 connected to the vacuum transfer containers 109, 110, and 111; gates and their openings connecting these to communicate with each other are disposed to coincide with each other in center positions in the height direction and the horizontal direction.

Similarly as for gates among the ashing processing unit 114, the cooling unit 115, and the bypass container 126 disposed to be interposed between them to connect them and gates among the ashing processing unit 116, the cooling unit 115, and the bypass container 127 disposed to be interposed between them to connect them, height positions of centers are also disposed to be the same. As a result, the robot arms 128 and 129 are prevented from moving in the vertical direction in operation of extension/contraction and movement of the arms, resulting in shortening of the operation time or cost reduction of products.

In the present embodiment, transfer of a high temperature wafer W subjected to the ashing processing is conducted between the vacuum containers in the ashing processing units 114 and 116 and the cooling unit 115 via the bypass containers 126 and 127, respectively. Therefore, insides of these containers become a single space communicated with each other via gates, and they are provided with the same pressure or pressures which are nearly equal to the extent that a hindrance is not constituted in the transfer operation.

Therefore, it becomes necessary to make pressures in these containers equal or nearly equal to the extent that a problem is not posed in the transfer operation, contamination of the wafer W, or generation of foreign objects, or to bring them close to such pressures before opening the gate valves 130 to 133 which open/close the gates between the containers. In the present embodiment, a path for evacuating the inside of the vacuum container of the ashing processing unit 114 and a path for evacuating the inside of the bypass container 126 are made to join and a common evacuation path 137 is provided.

The evacuation path 137 is connected to a roughing pump such as a rotary pump. On each of the evacuation paths, a valve for opening/closing the path is disposed and the pressure in each container can be adjusted independently by adjusting the degree of opening/closing of the valve. On the other hand, by bringing both valves into the open state, pressures in the two containers can be made closer to each other in a state in which the gate valve 130 disposed between the two containers is blocked.

Such a configuration is provided for the ashing processing unit 116 and the bypass container 127 in the same way; a common evacuation path 139 and valves disposed on evacuation paths from respective containers connected to it to open/close the paths are provided. On the other hand, for the cooling unit 115, a single evacuation path 138 and a valve disposed thereon are provided.

Incidentally, pressures in processing chambers in respective processing units, the bypass containers, and the vacuum transfer containers are set as described below in the present embodiment. The pressures at the time of processing in the processing chambers in the ashing processing units 114 and 116 are set equal to 500 Pa, and the pressures are set equal to 100 Pa when the gates communicating therewith are opened and the wafer W is transferred. In the processing chamber in the cooling unit 115, the pressure in the processing chamber at the time when conducting cooling processing is set equal to 1,000 Pa, and the pressure at the time when the wafer W is transferred in or out is set equal to 100 Pa.

Furthermore, the internal pressures of the bypass containers 126 and 127, the vacuum transfer containers 109 to 111, and the intermediate chamber containers 112 and 113 are set equal to 100 Pa. Insides of the bypass containers 126 and 127, the vacuum transfer containers 109 to 111, and the intermediate chamber containers 112 and 113 are spaces only for transferring the wafer W and in the present embodiment, therefore, the inside pressures are kept at 100 Pa when the vacuum processing apparatus 100 is operating.

On the right side in FIG. 1 of the row of the vacuum transfer containers 109 to 111 in the depth direction in the vacuum processing apparatus 100 according to the present embodiment, the ashing processing unit 117, the cooling unit 118, and the ashing processing unit 119 are arranged in order from the front to be connected to each other with gate valves 140 and 141 therebetween. Unlike the row of the processing chambers on the left side of the row in the depth direction of the vacuum transfer containers 109 to 111, bypass containers are not disposed between the units.

Namely, side walls of a vacuum container in the cooling unit 118 are opposed to and connected to side walls of vacuum containers in the ashing processing units 117 and 119. Incidentally, a plane shape, when viewed from the above, of each of the vacuum containers in the ashing processing units 117 and 119 and the cooling unit 118 is a rectangle or a shape of a combination of line segments which can be regarded as a rectangle and mounting stages 117', 118', and 119' are disposed in central parts in processing chambers inside, respectively. In the same way as the cooling unit 115, the mounting stage 118' in the cooling unit 118 has a configuration in which a passage for a coolant having a prescribed temperature lower than that of the wafer W provided at a high temperature to flow is provided so that it is adjusted to the temperature.

In the processing chamber in the cooling unit 118, robot arms 142 and 143 are disposed in the up-and-down direction in the drawing (the front-and-rear direction) and a mounting stage 118' is provided to be interposed between them. The robot arms 142 and 143 transfer the high temperature wafer W after being subjected to ashing processing in the ashing processing units 117 and 119 disposed respectively in front and in rear of the cooling unit 118 out from the mounting stages 117' and 119' respectively in the ashing processing units 117 and 119 to the mounting stage 118' and mount the wafer W thereon; in the same way as the mounting stage 115', on the mounting stage 118', due to an effect by a thermally conductive gas (for example, He gas) which is introduced into the processing chamber to flow while the wafer W is held with a gap from the top face, heat exchange is conducted between the wafer W and the mounting stage 118' and/or the gas, resulting in cooling of the wafer W.

Each of hands of the robot arms 142 and 143 on which the wafer W is mounted and held has a configuration moving in the up-and-down direction in the drawing (the front-and-rear direction). In other words, the robot arm 142 moves downward to receive the wafer W within the ashing processing unit 117, moves upward to exit from the inside, and moves further upward over the mounting stage 118' to transfer the wafer W and to deliver the wafer W to it. The robot arm 143 moves in a direction opposite to that of the robot arm 142 to receive and deliver the wafer W.

Arm movements of the robot arms 142 and 143 in the present embodiment are possible only in the up-and-down direction and, when viewed from the above, the directions are along a line which connects centers of mounting surfaces of the mounting stages 117' and 119'. The line segment coincides with center positions in the height direction and the horizontal direction of gates and their openings which are opened/closed by gate valves 140 and 141 and which cause insides of containers of the ashing processing units 117 and 119 and the cooling unit 118 to communicate with each other; these gates, the movement directions of the robot arms 142 and 143, and the line are disposed so as to coincide with each other.

In this configuration, the hand of the robot arm 142 slides and moves in a direction along the line described above and at an end of the movement distance the hand enters under the wafer W to receive/hand over the wafer W. Since it does not conduct a rotation operation unlike the robot arms 128 and 129 in this way, time required for the movement operation is shorter as compared with those.

The length of the arm or the moving distance of each of the robot arms 142 and 143 is determined so that at both ends of the movement the wafer W is mounted on a hand which is disposed in a tip part of the arm to hold the wafer W.

Namely, in a state in which the arm moves upward or downward and reaches the end of its movement range, the center position of the wafer W mounted on the hand (or a specific position on the hand equivalent to the center position) coincides with a center of a mounting surface of the mounting stage 117', 118', or 119' when viewed from the above or becomes a position beyond that in the movement direction.

Each of the vacuum containers of the ashing processing units 117 and 119 takes a plane shape of a rectangle (quadrilateral) or a shape which can be regarded as it when viewed from the above and is equipped with the cylindrical shaped mounting stage 117' or 119' in its internal processing chamber. As described above, the processing chambers are connected to and communicated with the vacuum transfer containers 109 and 111 via the gate valves 123 and 125, respectively, and the wafer W before processing is transferred in from the vacuum transfer container 109 or 111.

In the same way as the mounting stages 114' and 116', the mounting stages 117' and 119' have a plurality of through holes disposed on their mounting surfaces and a plurality of pins housed in these through holes can move in the vertical direction. In a state in which the pins move upward and the wafer W is mounted on the pins, their upper end parts can be in contact with the outer periphery of the wafer W and hold the wafer W.

Unlike the mounting stages 114' and 116' and the like, the pins and the through holes in the mounting stages 117' and 119' are four and are disposed equally, that is, at equal angle intervals on a circumference having the same radius as that of the wafer W from a center of the corresponding mounting surface. In this configuration, the outer periphery of the wafer W is held by tip parts of the four pins in a position where the tips of the pin are raised from the mounting surface.

In the processing chambers in the ashing processing units 117 and 119, processing gas and the electric field are introduced to form plasma and ashing processing of the wafer W is conducted, in the same way as other ashing processing units. The pressure in the processing chambers in the ashing processing units 117 and 119 at this time is 500 Pa in the same way.

Upon finishing the ashing processing in the ashing processing unit 117 or 119, an inert gas (for example, nitrogen gas) is supplied to the processing chamber, and the gate valve 140 or 141 disposed respectively in-between with the cooling unit 118 is opened so that the robot arm 142 or 143 transfers the high temperature wafer W after the processing into the processing chamber in the cooling unit 118.

The gate valve 140 or 141 opens/closes the gate which communicates the ashing processing unit 117 or 119 and the cooling unit 118 with each other therebetween. The gate is opened only when the arm of the robot arm 142 or 143 enters or exits from the inside of the processing chamber to transfer the wafer W mounted on the mounting stage 117' or 119' and, in a state in which the gate is closed, the processing chamber in the ashing processing unit 117 or 119 is kept at the blocked state.

The gate valves 123 to 125, 140, and 141 in the present embodiment conduct the opening operation exclusively, in the same way as the gate valves 120 to 122 and 130 to 133 in the left row of the processing chambers. For example, the gate valve 140, which opens/closes the gate which causes the processing chamber in the ashing processing unit 117 and the processing chamber in the cooling unit 118 to communicate with each other and partitions insides of them hermetically, conducts the opening operation only when all of other gate valves 123, 124, and 141 which open/close other gates communicating with the two processing chambers are in the blocked state.

Such an exclusive opening operation is conducted in other gate valves 124, 125, 140, and 141 in the same way as well, and start and stop of the operation are adjusted by the control part which commands these operations. Owing to such a configuration, it is prevented that spaces within two containers partitioned by a valve which is about to conduct an opening/closing operation communicate with inside of a container other than them and contamination spreads without intention, and an event that particles of the wafer W in a state in which the particles causing foreign objects in the surroundings are not decreased intrude into a chamber other than the two chambers having the gate opened and contaminate the inside thereof, that is so-called cross contamination, can be prevented.

As described above, the mounting stages 117', 118', and 119' are located on a straight line in the front-and-rear direction when viewed from the above and the gates are disposed on this line.

Furthermore, a line which connects a center of the mounting surface of the mounting stage 118' and a center axis of the rotation operation of the vacuum transfer robot 135 in the vacuum transfer chamber of the vacuum transfer container 110 is disposed so as to coincide in the position and the height with a center of a gate which causes the vacuum transfer chamber in the vacuum transfer container 110 to communicate with the processing chamber in the cooling unit 118; an extension operation of an arm of the vacuum transfer robot 135 is adjusted so that it passes through the gate along the line passing through the center according to a command from the control part.

Then, the center of the mounting surface of the mounting stage 118' is disposed on a line which connects centers of the mounting surfaces of the mounting stage 117' and the mounting stage 119', when viewed from the above. Furthermore, when viewed from the above, the line which connects the rotation axis of the vacuum transfer robot 135 and the center of the mounting surface of the mounting stage 118' is perpendicular with respect to the line which connects centers of the mounting surfaces of the mounting stage 117' and the mounting stage 119'.

In addition, when viewed from the above, the line which connects the mounting stage 117', the mounting stage 119', and the mounting stage 118' is disposed in parallel to the line which connects the rotation axes of the respective vacuum transfer robots 134 to 136.

Also, the line which connects the rotation axes of the vacuum transfer robots 134 to 136 is disposed to pass through centers in the horizontal direction of the storage parts in the intermediate chamber containers 112 and 113 and a center of a mounting stage for the wafer W in the lock chamber 106.

As described above, four pins which move up and down with respect to the top face of the mounting stage are disposed on each of the mounting stages 117', 118', and 119' and two of the four pins on each mounting stage are disposed at equal distances from a gate which causes a processing chamber in which the mounting stage is disposed to communicate. The arm of the vacuum transfer robot 134, 135, or 136 or the arm of the robot arm 142 or 143 enters between the two pins disposed at equal distances from the gate and receives/delivers the wafer from/to the pins.

As described above, the gate valve 140 or 141 is opened, and the wafer W which has been processed within the ashing processing unit 117 or 119 and becomes high in temperature is transferred from it into the cooling unit 118 and mounted. At this time, pressures in the processing chambers in the two units are brought to be close to each other to the extent that a hindrance to transfer or a problem of contamination is not posed, or are made equal to each other similar to the row of the processing units on the left side.

In the present embodiment, the processing chambers in the ashing processing units 117 and 119 and the cooling unit 118 are connected to evacuation paths 144, 146, and 145 for evacuating internal gas, respectively, and they are connected to a roughing pump. Furthermore, valves are disposed on these evacuation paths to open/close them. Pressures in these processing chambers are adjusted independently by adjusting the degrees of opening/closing of these valves.

When transferring the wafer W, the pressure in each of the processing chambers in the ashing processing units 117 and 119 and the processing chamber in the cooling unit 118 is set equal to 100 Pa which is a value used for transfer. When it is detected that both sides become equal to this value, one of the gate valves 140 and 141 corresponding to the gate to be used for transferring the wafer W is opened.

The pressure in the processing chamber in the ashing processing unit 117 or 119 is set equal to 500 Pa at the time of ashing processing in the same way as the left row, and set equal to 100 Pa at the time of transfer of the wafer W. The internal pressure in the processing chamber in the cooling unit 118 is also set equal to 1,000 Pa at the time of cooling processing in the same way as the left row, and set equal to 100 Pa at the time of transfer of the wafer W. The pressure value of 100 Pa is equal to the pressure in the chambers inside the vacuum transfer containers 109 to 111.

Incidentally, in the present embodiment, the gates are disposed between the respective processing units, the respective transfer containers, and the lock chamber and the gate valves which open/close them are equipped but, in the row of the vacuum transfer containers 109, 110, and 111 and the intermediate chamber containers 112 and 113 disposed between them to connect, gate valves which open/close the gates for causing the internal spaces of them to communicate with each other are not provided. In other words, gates which cause the vacuum transfer containers 109, 110, and 111 and the intermediate chamber containers 112 and 113 disposed between them to communicate with each other are left open and insides of these containers are kept in the communicating state as a united space and are set equal to the same pressure of 100 Pa.

In the vacuum processing apparatus 100 according to the present embodiment as described above, the wafer W is processed in the following manner. An arbitrary wafer W stored in a cassette mounted on the cassette stage 104 is taken out from the cassette and transferred by the atmospheric transfer robot, position-aligned in the aligner 105, and then introduced from the lock chamber 106 into the vacuum side block 102.

In the vacuum side block 102, the wafer W is transferred to the ashing processing unit 114 or 116 by the vacuum transfer robot 134 or the vacuum transfer robot 136, subjected to ashing processing, and then transferred to the cooling unit 115 via the bypass container 126 or 127 to be subjected to cooling processing. Or in the vacuum side block 102, the wafer W is transferred to the ashing processing unit 117 or 119 by the vacuum transfer robot 134 or the vacuum transfer robot 136, subjected to ashing processing, and then transferred to the cooling unit 118 to be subjected to cooling processing.

After then, it is transferred out into the vacuum transfer container 110 by the vacuum transfer robot 135, transferred to the lock chamber 106, returned to the atmospheric side block 101, and returned to the original position in the original cassette. In the above described example, the wafer W introduced into the vacuum side block 102 is transferred to one of the ashing processing units 114, 116, 117 and 119 to be subject to first processing.

The ashing processing unit to which the wafer W is to be transferred is selected by evacuation of the inside of the lock chamber 106 is finished with the wafer W stored therein and the gate valve 108 is opened, and the control unit causes the vacuum transfer robot 134 to conduct an operation to the transfer destination according to the selection. As for such a selection, a result of execution in a host computer which adjusts operation of a semiconductor device manufacturing line in a building having the vacuum processing apparatus 100 installed therein may be sent to the control part via a communication means, or upon receiving such information or data of the host computer the control part may conduct selection based on it. Instead, a user may specify in advance prior to operation of the vacuum processing apparatus 100.

As described above, the gate valves 108, 120 to 125, 130 to 133, 140, and 141 in the present embodiment conduct the gate opening operation exclusively. A gate valve which opens/closes an arbitrary gate opens the arbitrary gate, only when all gate valves which open/close other gates disposed in two chambers connected with it put in-between are in the blocked state so that spread of contamination is suppressed.

The arbitrary wafer W stored in the cassette on the cassette stage 104 is taken out from the cassette by the atmospheric transfer robot which operates in accordance with a command given by the host computer which is not illustrated or the like, transferred to the aligner 105 disposed on the side wall at the left end in the drawing of the atmospheric transfer container 103, and subjected to position alignment in the aligner 105. The aligner 105 includes a stage which rotates with the wafer W mounted thereon and a configuration which can move the wafer W in directions of two axes in the horizontal plane so that the center of the wafer and an angular position with respect to it of a part having a specific shape such as a cutout, a groove, or a notch disposed in advance on the outer periphery of the wafer W.

In the same way as the vacuum transfer robots 134 to 136, the atmospheric transfer robot in the present embodiment includes a plurality of multi joint arms. Therefore, an interchange operation may be conducted in which a wafer W taken out from a cassette is transferred to the aligner 105 while being held on a hand of an arm, another wafer W already transferred to the aligner 105 and subjected to position alignment is moved from top of the stage in the aligner 105 onto a hand of another arm, and the wafer W before position alignment held on the hand of the former arm is placed on the stage in the aligner 105.

The atmospheric transfer robot moves in the horizontal direction along a rail in the atmospheric transfer container 103. This rail is disposed to extend from the leftmost to the rightmost among the plurality of cassette stages 104 disposed on the front face side of the atmospheric transfer container 103. Furthermore, the interchange operation of the wafer W by operations of a plurality of arms may be conducted not only in the aligner 105 but also on a cassette or in the lock chamber 106.

For example, since the lock chamber 106 in the present embodiment has two vacuum containers laid one on top of the other and connected to the atmospheric transfer container 103 behind its rear face so that each of the two containers has both a load function and an unload function, after mounting a processed wafer W stored in a container onto a hand of an arm having no wafer mounted thereon and taking it out with the gate valve 107 opened, another unprocessed wafer W finished with position alignment and mounted on a hand of another arm may be transferred into the same container by extending the arm. Regarding the container in the lock chamber 106, once the unprocessed wafer W is mounted on a mounting stage inside and the arm exits, the gate valve 107 is closed and the interior of the container is evacuated and depressurized to a pressure of a prescribed degree of vacuum suitable for transfer.

On the other hand, upon receiving the processed wafer W onto its hand, the atmospheric transfer robot transfers and returns the wafer W to an original position of an original cassette in which the wafer W was stored. In addition, if there is a different wafer W to be processed in the cassette, according to a command from the host computer, the control part, or the user, it is taken out from the cassette and transferred to the aligner 105.

When depressurization to the prescribed pressure in the lock chamber 106 is finished with the unprocessed wafer W transferred by the atmospheric transfer robot being stored inside, then the gate valve 108 is opened. This opening is conducted with the gate valves 120 to 125 blocked.

The vacuum transfer robot 134 enters the lock chamber 106, mounts a wafer W on the mounting stage inside onto a hand on one of its arms to hold, and transfers out from the inside of the lock chamber 106. At this time, one of the ashing processing units 114, 116, 117, and 119 to which the wafer W is to be transferred has been selected according to a command signal from the host computer, the control part, or the user.

When the vacuum transfer robot 134 holds a processed wafer W on a hand of another arm, the interchange operation is conducted in which this arm is extended to cause the hand enter the lock chamber 106 to mount the processed wafer W onto an unoccupied mounting stage, contracts, and exits. After the processed wafer W is stored, the gate valve 108 is blocked to hermetically seal the inside of the lock chamber 106, an inert gas such as nitrogen gas is introduced to the inside, and the pressure in the internal storage chamber is raised to the atmospheric pressure or a pressure which is slightly higher than that.

Hereafter, an example of the case where the wafer W is transferred to the ashing processing unit 114 or 116 is described.

The vacuum transfer robot 134 extends its one arm and transfers an unprocessed wafer W held thereon into the processing chamber in the ashing processing unit 114. When it is detected at the time of transfer that the pressure in the processing chamber and the pressure in the vacuum transfer chamber in the vacuum transfer container 109 are equal to each other or close to each other to the extent that a hindrance is not regarded to be constituted, the gate valve 120 which opens/closes between the processing chamber and the vacuum transfer chamber is opened with other gate valves 121 to 125 and 130 kept in blocked states, in accordance with a command signal from the control part.

After the hand moves to over the mounting stage 114' in the ashing processing unit 114 owing to the extension operation of the arm, the wafer W is delivered onto the pins as described above. Upon exit of the hand from the processing chamber due to contraction of the arm, the gate valve 120 is blocked.

Incidentally, the pressure in the processing chamber and the vacuum transfer chamber made equal or close to each other before opening the gate valve 120 is 100 Pa. Since the pressure of ashing processing in the processing chamber in the ashing processing unit 114 is 500 Pa, the pressure in the processing chamber is depressurized to 100 Pa or a value close to it before the valve 120 is opened.

Upon blocking of the gate valve 120, the wafer W is held on the mounting stage 114', the inside of the processing chamber in the ashing processing unit 114 is hermetically sealed, a gas for processing is introduced into the processing chamber, and the pressure is raised to a pressure (500 Pa) which is set for the processing. Once it is detected that the pressure has reached a value suitable for the processing, an electric field is supplied into the processing chamber to excite the processing gas and plasma is formed in the space over the mounting stage 114'. The wafer on the mounting stage 114' is subject to ashing processing using this plasma.

When it is judged after elapse of a predetermined time that the processing has finished by the control part, the supply of the electric field and the introduction of the processing gas are stopped and the plasma disappears. As a result, the processing is finished.

Next, the wafer W subjected to the ashing processing is to be transferred from the processing chamber in the ashing processing unit 114. Instead of the processing gas, an inert gas (nitrogen gas) is introduced into the processing chamber and the inside of the processing chamber is evacuated to reduce the pressure in the processing chamber to 100 Pa at which transfer is conducted. Furthermore, the gas in the processing chamber is replaced with the inert gas. Also, the pins move upward in accordance with a command from the control part to lift and hold the wafer W over the mounting stage 114'.

Once it is detected that the pressure is lowered to 100 Pa or a pressure close to it, the gate valve 130 is opened to cause the processing chamber in the ashing processing unit 114 to communicate with the space in the bypass container 126 via the gate. This opening operation is conducted with the gate valves 120 and 131 kept in the blocked state.

The robot arm 128 extends its arm and enters the inside of the processing chamber, and moves its hand between two pins. The wafer W subjected to the ashing processing is mounted on the hand and delivered thereto as the pins move downward and the wafer W is transferred from the processing chamber while it is held on the hand by contracting the arm. Once the wafer W is transferred out, the gate valve 130 is closed again and the inside of the processing chamber in the ashing processing unit 114 is hermetically sealed. Incidentally, the processing chamber in the ashing processing unit 114 is supplied with the inert gas and its pressure is maintained at 100 Pa suitable for transfer until a next unprocessed wafer W is transferred in.

When the arm contracts until the wafer W arrives at a prescribed position in the vicinity of the gate valve, it rotates around its rotation axis to cause rotation movement of the wafer and moves it as far as a position opposed to the gate for communicating with the cooling unit 115 provided with the gate valve 131. In this state, the extension direction of the arm which holds the wafer W is opposed to the gate.

With the gate valves 132 and 121 in the blocked state, the gate valve 131 is opened and the inside of the bypass container 126 communicates with the processing chamber in the cooling unit 115. The arm of the robot arm 128 extends and the wafer W is transferred into the processing chamber in the cooling unit 115, delivered to the mounting stage 115', and mounted thereon. However, the wafer W is held at its outer periphery by tips of three pins with a prescribed gap over the top face of the mounting stage 115'.

Before the gate valve 131 is opened, the same inert gas as that of the inside of the bypass container 126 is introduced into the inside of the processing chamber in the cooling unit 115, and it is detected that it is the same or nearly the same pressure of the inside of the bypass container 126 of 100 Pa. Then, the gate valve 131 is opened.

Once the robot arm 128 contracts to exit from inside of the processing chamber in the cooling unit 115, the gate valve 131 is blocked and the processing chamber in the cooling unit 115 is hermetically sealed.

After then, a thermally conductive gas (He gas) for cooling is introduced into the processing chamber to replace the inert gas in the processing chamber and the pressure of the inside is raised to 1,000 Pa which is a value suitable for cooling. A refrigerant flow channel, through which a refrigerant of a temperature lower than that of the wafer W flows, is disposed within the mounting stage 115'; the mounting stage 115' is made at a prescribed temperature by the flow of the refrigerant and heat transfer is enhanced between the mounting stage 115' and the wafer W by letting the thermally conductive gas flow in-between with the wafer W held over it and also heat exchange is conducted between the gas flowing around the wafer W and the wafer W so that the wafer is cooled.

When it is detected that flowing of the He gas has been conducted for a prescribed time, supply of He is stopped and the cooling is substantially finished. Then, nitrogen gas is introduced into the processing chamber and the gas in the processing chamber is evacuated to exchange He gas and nitrogen gas.

Once it is detected, after cooling of the wafer W is finished, that the pressure in the processing chamber becomes 100 Pa suitable for transfer, the gate valve 121 is opened. One arm of the vacuum transfer robot 135 which does not hold the wafer W enters the processing chamber and moves its hand between pins as far as under the wafer W.

The wafer W is handed over onto the hand owing to the lowering of the pins, the arm is contracted, and the hand and the wafer W exit from the processing chamber as being transferred out. Once the arm exits, the gate valve 121 blocks to seal the inside of the processing chamber hermetically again. Incidentally, the inert gas is introduced into the processing chamber in the cooling unit 115 and the pressure of the inside is kept at 100 Pa until the next wafer W to be cooled is transferred.

The processed wafer W transferred into the vacuum transfer container 110 is transferred to the intermediate chamber container 112 by the operation of the vacuum transfer robot 135 and mounted on its storage part. If there is an unprocessed wafer W stored in the intermediate chamber container 112 at that time, an interchange operation with it may be conducted.

The vacuum transfer robot 134 mounts the processed wafer W stored in the intermediate chamber container 112 onto one of its arms to take it out and introduces it into the vacuum transfer chamber in the vacuum transfer container 109. If there is an unprocessed wafer W held on another arm of the vacuum transfer robot 134 at this time, an interchange operation with it may be conducted.

Incidentally, the vacuum transfer robot 135 transfers the processed wafer W, which is transferred out from the inside of the cooling unit 115, into a lower stage of a rack having a plurality of stages disposed in the storage part in the intermediate chamber container 112 to remount. The rack is configured to have a plurality of stages in the vertical direction so that it can mount and store a wafer W inside of each stage with a space above and below.

After the arm of the vacuum transfer robot 135 exits from the storage part, the vacuum transfer robot 134 extends its arm and causes it to enter the intermediate chamber container 112 in accordance with a command signal from the control part. At this time, the arm causes the hand to enter below the wafer W stored in the lower stage of the rack in the storage part and then move upward so that the wafer W is mounted on the hand to be lifted up and held. As a result, the wafer W is handed over from the rack to the hand.

Upon completion of the delivery, the arm contracts and the wafer W is transferred into the vacuum transfer container 109. Incidentally, as for the intermediate chamber containers 112 and 113 in the present embodiment, only one vacuum container is shown in FIG. 1 viewed from the above; in the same way as the lock chamber 106, however, two vacuum containers are laid one on top of the other in the vertical direction and are connected to and disposed between the vacuum transfer containers 109 and 110 and the vacuum transfer containers 110 and 111, respectively. In addition, the above-described rack having a plurality of stages is disposed within each of these vacuum containers so that each of the intermediate chamber containers 112 and 113 is configured to be able to store and hold four or more wafers W therein.

In addition, the vacuum transfer robot 134 transfers the processed wafer W held on its one arm to a chamber in the lock chamber 106 which has no wafer W stored therein or which has an unprocessed wafer W stored therein and is opened. If there is an unprocessed wafer W stored in the chamber in the lock chamber 106 at this time, an interchange operation with it may be conducted.

A case where an unprocessed wafer W is transferred to the vacuum transfer container 111 and then transferred to the ashing processing unit 116 is now described next. If processing is being executed in the ashing processing unit 114 in a state in which an unprocessed wafer W is stored in the lock chamber 106 and the gate valve 108 is opened, then the wafer W is transferred as far as the vacuum transfer container 111 and processing of the unprocessed wafer W is conducted in the ashing processing unit 116.

At this time, the vacuum transfer robot 134 takes out the unprocessed wafer W from the inside of the lock chamber 106 and stores it into an upper stage of the rack in the storage part within one of the vacuum chambers in the intermediate chamber container 112, in accordance with a command from the control part. After transferring the unprocessed wafer W into the intermediate chamber container 112, the vacuum transfer robot 134 contracts the arm to exit from it. If the intermediate chamber container 112 has a processed wafer W stored therein at this time, the vacuum transfer robot 134 may conduct an interchange operation.

Next, the unprocessed wafer W stored in the upper stage of the rack is mounted by the vacuum transfer robot 135 on one of its arms in an operation similar to that of the vacuum transfer robot 134, and transferred into the vacuum transfer container 110. If there is a processed wafer W held on another arm of the vacuum transfer robot 135 at this time, an interchange operation with the unprocessed wafer W in the intermediate chamber container 112 may be conducted.

In addition, the vacuum transfer robot 135 stores the unprocessed wafer W held on one arm thereof into one vacuum chamber in the intermediate chamber container 113 so that it is stored into an upper stage of a rack inside. If there is a processed wafer W stored in the intermediate chamber container 113 at this time, an interchange operation with it may be conducted.

Thereafter, the vacuum transfer robot 136 mounts the wafer W on one arm thereof to take it out from the rack in the storage part in the intermediate chamber container 113 and transfers it into the vacuum transfer chamber in the vacuum transfer container 111. As for the unprocessed wafer W held on the arm of the vacuum transfer robot 136, in a state in which the gate valve 122 is opened and the gate which causes the inside of the processing chamber in the ashing processing unit 116 and the inside of the vacuum transfer chamber in the vacuum transfer container 111 to communicate with each other is opened, the arm of the vacuum transfer robot 136 extends through the gate, moves the unprocessed wafer W on the hand to over the mounting stage 116' in the processing chamber in the ashing processing unit 116, shifts the wafer W onto tips of three pins which protrude the tips to above the mounting surface of the mounting stage 116', and transfers the wafer W into the processing chamber. Incidentally, as for the processing chamber in the ashing processing unit 116, nitrogen gas is introduced into the inside to replace the process gas and the internal pressure is set equal to 100 Pa suitable for transfer before the gate valve 122 is opened.

The gate valve 122 is blocked again and the inside of the processing chamber in the ashing processing unit 116 is hermetically blocked; when the wafer W is held over the mounting surface of the mounting stage 116', the nitrogen gas is evacuated from the processing chamber and a process gas is introduced therein. In addition, the pressure in the processing chamber is raised to 500 Pa matched to the processing condition and maintained.

In this state, an electric field is supplied to the inside of the processing chamber, and plasma is formed in a space over the mounting stage 116' in the processing chamber using the process gas so that ashing processing is conducted using it on a film to be subjected to the ashing processing disposed on the top face of the wafer W. When a prescribed time elapses after start of the processing, it is detected that the processing is finished.

Thereafter, in the same way as the case where processing on the wafer is conducted in the ashing processing unit 114, the wafer W is transferred through the bypass container 127 into the processing chamber in the cooling unit 115 and mounted on the mounting stage 115'. Thereafter, in the same way as the case where processing on the wafer is conducted in the ashing processing unit 114, cooling processing is conducted and, then, it is transferred into the vacuum transfer container 110. In the same way as the case where processing on the wafer is conducted in the ashing processing unit 114, the processed wafer W transferred into the vacuum transfer container 110 is returned to the lock chamber 106 through the vacuum transfer container 109 and returned to the original position in the original cassette in the atmospheric side block 101.

In the above described processing, the unprocessed wafer W is not transferred into a space constituted by the vacuum transfer containers 109 to 111 and the intermediate chamber containers 112 and 113 from the time when it is stored in the lock chamber 106 and transferred into the ashing processing unit 114 through the vacuum transfer container 109 until it is transferred to the cooling unit 115, subjected to the cooling processing, and transferred into the vacuum transfer container 110. In other words, it does not pass through this space. Furthermore, the unprocessed wafer W transferred through the vacuum transfer containers 109 to 111 and the intermediate chamber containers 112 and 113 and transferred into the ashing processing unit 116 does not pass through the space constituted by the vacuum transfer containers 109 to 111 and the intermediate chamber containers 112 and 113 until it is transferred into the vacuum transfer container 110 after being subjected to the cooling processing in the cooling unit 115.

In other words, if the unprocessed wafer W is transferred to the left row of the processing units, it passes through a transfer path in which it is transferred from the lock chamber 106 to the ashing processing unit 114 through the vacuum transfer container 109, transferred from the ashing processing unit 114 to the cooling unit 115 via the bypass container 126, then transferred from the cooling unit 115 to the vacuum transfer container 110, and transferred from the space constituted by the vacuum transfer containers 109 to 111 and the intermediate chamber containers 112 and 113 into the lock chamber 106. Or it passes through another transfer path in which it is transferred from the lock chamber 106 to the ashing processing unit 116 through the vacuum transfer container 109, transferred from the ashing processing unit 116 to the cooling unit 115 via the bypass container 127, then transferred from the cooling unit 115 to the vacuum transfer container 110, and transferred from the space constituted by the vacuum transfer containers 109 to 111 and the intermediate chamber containers 112 and 113 into the lock chamber 106.

These transfer paths are classified into "processing paths", in which it is transferred from the ashing processing unit 114 (or 116) to the cooling unit 115 via the bypass container 126 (or 127) and subjected to processings sequentially in the processing units, and "cold paths", which are composed of a path for transferring from the lock chamber 106 toward the ashing processing unit 114 (or the ashing processing unit 116) through the space constituted by the vacuum transfer containers 109 to 111 and the intermediate chamber containers 112 and 113, and a path for transferring from the cooling unit 115 into the space constituted by the vacuum transfer containers 109 to 111 and the intermediate chamber containers 112 and 113 and then transferring through the space to the lock chamber 106 and in which the wafer W is already cooled or is in the state before processing and not high in temperature; there is no overlap between them. Incidentally, in the "processing paths," the wafer W is in the state in which it is being subjected to processing with plasma formed or it is made high in temperature.

Next, transfer in a case where the wafer W is processed in the row of the processing units disposed on the right side of the space constituted by the vacuum transfer containers 109 to 111 and the intermediate chamber containers 112 and 113 in the drawing in FIG. 1 is now described.

The vacuum transfer robot 134 extends one arm thereof and transfers the unprocessed wafer W held thereon into the processing chamber in the ashing processing unit 117. When it is detected upon transferring in that the pressure in the processing chamber and the pressure in the vacuum transfer chamber in the vacuum transfer container 109 are equal or nearly equal to an extent that a hindrance is not constituted, the gate valve 123 which opens/closes between the processing chamber and the vacuum transfer chamber is opened with other gate valves 120 to 122, 124, 125, and 140 being kept in the blocked state, in accordance with a command signal from the control part. By the extension operation of the arm, its hand moves to over the mounting stage 117' in the ashing processing unit 117, delivers the wafer W onto the pins as described above, and exits from the processing chamber; then, the gate valve 123 is blocked.

In the same way as the operation in the left row of the processing units, even in the operation in the right row of the processing units, it is detected before opening the gate valve 123 that the pressures in the processing chamber in the ashing processing unit 117 and in the vacuum transfer container 109 are equal or nearly equal. Furthermore, the pressure in the ashing processing unit 117 is set equal to 500 Pa at the time of ashing processing and is set equal to 100 Pa at the time of transfer of the wafer W in the same way as the operation of the processings in the left row.

Once the gate valve 123 is blocked and the processing chamber in the ashing processing unit 117 is hermetically sealed, replacement of the nitrogen gas with the process gas is conducted and the pressure in the processing chamber is raised to 500 Pa suitable for the ashing processing. Thereafter, plasma is formed in the processing chamber and the wafer W is subjected to ashing processing.

Then, nitrogen gas is introduced into the processing chamber to conduct replacement of the process gas in the processing chamber with the nitrogen gas and the pressure in the processing chamber is lowered to 100 Pa which is suitable for transfer. Thereafter, the gate valve 140 is opened and the processed wafer W is transferred into the cooling unit 118 by the robot arm 142.

When the wafer W is transferred into the cooling unit 118, the gate valve 140 is blocked and the inside of the processing chamber in the cooling unit 118 is hermetically sealed. In addition, after the robot arm 142 moves upward in the drawing to moves the wafer W to above the mounting stage 118', the wafer W is held by tips of four pins over the mounting stage 118' and delivered.

Then, the robot arm 142 moves downward in the drawing to move its hand from under the wafer W so that in a state in which the wafer W is held by the tips of the pins mounting of the wafer is conducted with a prescribed gap maintained between the wafer W and the mounting surface of the mounting stage 118'. Then, after a thermally conductive gas (He gas) for cooling is introduced into the processing chamber and the pressure of the inside of the processing chamber is raised to 1,000 Pa, cooling of the wafer W is conducted by heat transfer between the mounting stage 118' and the wafer W and heat exchange with the He gas.

Incidentally, as for the robot arms 142 and 143 in the present embodiment, the moving distance due to slide and the arm length are set so as to be able to transfer the wafer W between the mounting stages 117' and 119' and the mounting stage 118' by only movement due to slide in the up-and-down direction in the drawing (the front-and-rear direction). The wafer W may be transferred between the mounting stages, however, by rotating the robot arms 142 and 143 around rotation axes in the vertical direction by 180 degrees to change the arm extension direction to an opposite direction by 180 degrees in a state in which these arms hold the wafer on their hands and the gate valves 140 and 141 on both end sides are closed to seal.

Once it is judged that cooling on the mounting stage 118' in the cooling unit 118 has been conducted for a prescribed time and finished, the gas in the processing chamber in the cooling unit 118 is replaced with nitrogen gas and the pressure is lowered to 100 Pa suitable for transfer. When it is detected that the pressure in the vacuum transfer chamber in the vacuum transfer container 110 and the pressure in the processing chamber in the cooling unit 118 are equal or nearly equal, the gate valve 124 is opened exclusively.

Then, in the same way as the case of the cooling unit 115, the vacuum transfer robot 135 extends its arm, receives the wafer W mounted on the mounting stage 118', contracts the arm to transfer the wafer W out, and the gate valve 124 is blocked to hermetically seal the processing chamber in the cooling unit 118.

Thereafter, in the same way as the case of the processing in the left row of the processing units, the processed wafer W transferred into the vacuum transfer container 110 is returned to the original position in the original cassette via the lock chamber 106.

If the ashing processing unit 117 is in use and the gate valve 123 cannot be opened in a state in which the unprocessed wafer W is stored in the lock chamber 106 and the gate valve 108 is opened, the wafer W is transferred as far as the vacuum transfer container 111 and transferred into the ashing processing unit 119 in the same way as the case of the left row of the processing units.

In this case, the unprocessed wafer W is transferred as far as the vacuum transfer container 111 in the same way as the case of processings in the left row of the processing units.

When the unprocessed wafer W is transferred into the vacuum transfer chamber in the vacuum transfer container 111, it is detected that the pressures in the processing chamber in the ashing processing unit 119 and in the vacuum transfer chamber are equal or nearly equal and the gate valve 125 is opened exclusively so that the wafer W is transferred into the processing chamber in the ashing processing unit 119 and mounted on the mounting stage 119' by the vacuum transfer robot 136. After then, the vacuum transfer robot 136 exits from the processing chamber and the gate valve 125 is blocked.

After replacement of gas and pressure increase in the processing chamber are conducted in the same way as the ashing processing unit 117, processing on the wafer W is started; after it is stopped, the wafer W is transferred into the cooling unit 118 and its cooling processing is conducted on the mounting stage 118'. Transfer in which it is transferred to the vacuum transfer container 110 and returned to the original position in the original cassette via the lock chamber 106 after the cooling is in the same way as the case of the processing in the ashing processing unit 117.

In the same way as the left row of the processing units, even in the processing flow in the right row of the processing units, the unprocessed wafer W is neither transferred into or passed through the space (cold chamber) constituted by the vacuum transfer containers 109 to 111 and the intermediate chamber containers 112 and 113 from the time when it is transferred into the ashing processing unit 117 or 119 until it is transferred out from the cooling unit 118 after completion of the ashing processing and the cooling processing.

In other words, as for paths for transferring the wafer W in processing in the right row of the processing units, there is no overlap in processing chambers, vacuum transfer chambers, or intermediate chambers, which constitute paths, between a path through which it is transferred from the ashing processing unit 117 or 119 into the cooling unit 118 through a gate for causing their chambers to communicate with each other and is holding in the vacuum container in the cooling unit 118 until being transferred out to the vacuum transfer container 110, that is the processing path, and the cold paths through which the cooled wafer W is transferred from the lock chamber 106 into the ashing processing unit 117 through the vacuum transfer container 109, through which it is transferred from the lock chamber 106 through cold chambers from the vacuum transfer container 109 to 111 until it is transferred into the ashing processing unit 119, and through which it is transferred from the cooling unit 118 into the vacuum transfer container 110 until it is transferred to the lock chamber 106 through cold chambers.

According to the above described configuration, the transfer path for transferring the wafer W of before ashing processing or after cooling processing, which is at a low temperature and reduced in particles generating foreign objects to the surroundings, and the transfer path for transferring from the processing chamber in which ashing processing is conducted to the processing chamber in which cooling is conducted are configured to be separated from each other so that it is prevented the wafer W from passing through the inside of the same chamber before and after the processings and, accordingly, it is possible to suppress and avoid contamination of the wafer W or members in a chamber in which it is transferred and occurrence of cross contamination in which contamination arises between different chambers.

On the other hand, as for the space constituted by the vacuum transfer containers 109 to 111 and the intermediate chamber containers 112 and 113 in the present embodiment, chambers in these containers communicate with each other via gates and gate valves which open/close these gates to hermetically seal are not provided so that they constitute a substantially united chamber. This chamber space becomes a space (cold chamber) for transferring only the unprocessed or cooled wafer W by the cooling unit 115 or 118 after being subjected to ashing processing, as described above. This space is hermetically sealed from the processing units at the boundary in the horizontal direction by the gate valves 120 to 125.

In other words, the present embodiment has a configuration in which the cold chamber is connected to the lock chamber 106 and the wafer W before start of processings or after finishing of the processings is transferred to/from the atmospheric side block 101 through the cold chamber. Since the wafer W passing thought the cold chamber is low in temperature and its surroundings are reduced in particles causing foreign objects, occurrence of contamination of the wafer W and the surface of members disposed in the chambers constituting the cold chamber is suppressed. Therefore, gate valves for sealing the gates which cause the plurality of containers constituting the cold chamber to communicate with each other are not disposed.

Regardless of the embodiment described above, such gate valves may be provided according to a user's request or specifications. Furthermore, even if the gate valves are provided, the cold chamber can be made a united space by keeping their open state when transferring the wafer W.

Embodiment 2

Figure 2:
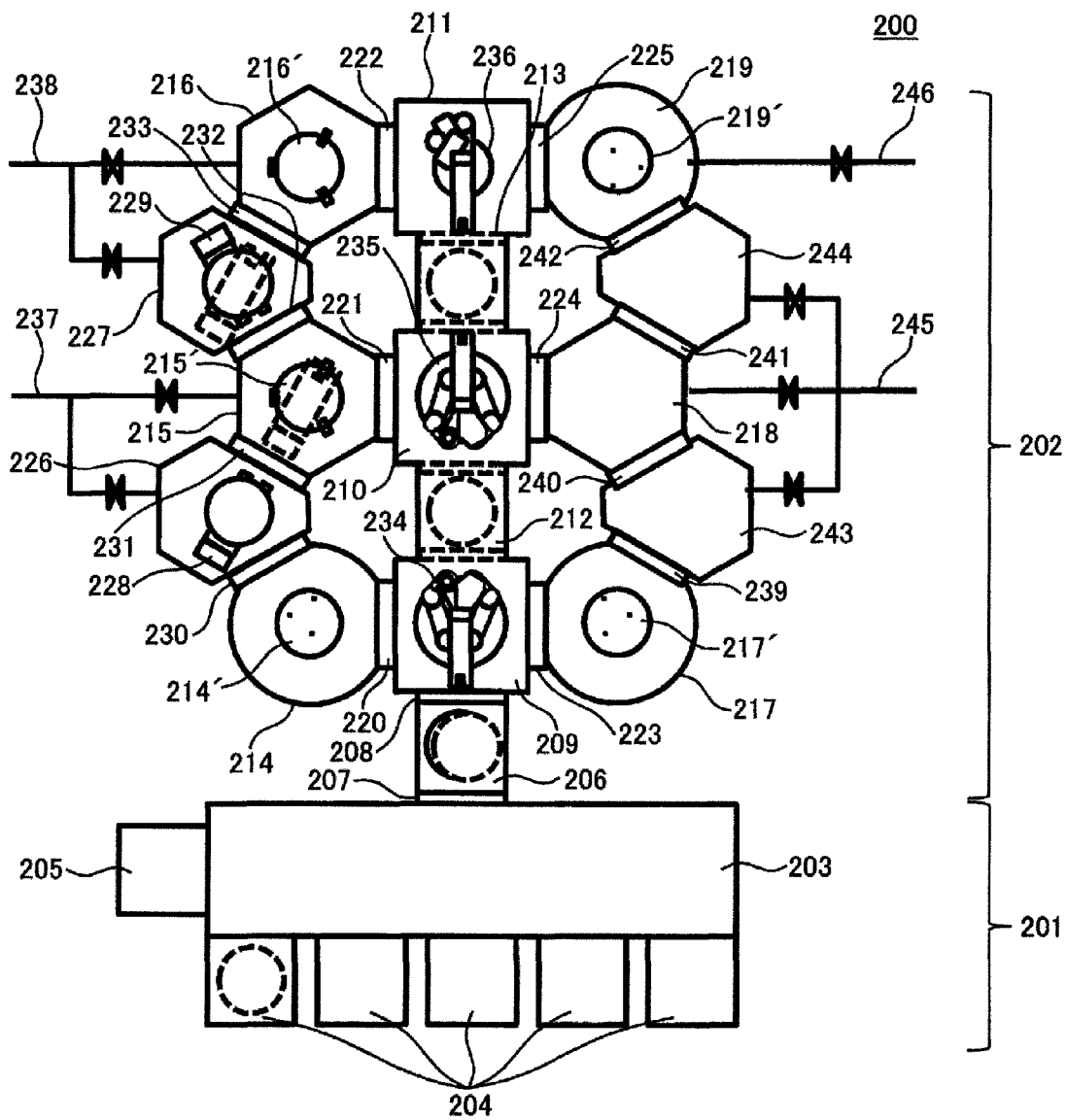
FIG. 2 is a top view showing an outline of a vacuum processing apparatus according to another embodiment of the present invention.

A vacuum processing apparatus according to another embodiment of the present invention is now described with reference to FIG. 2, next. FIG. 2 is a top view showing the different embodiment of a vacuum processing apparatus according to the present invention.

In the same way as the embodiment shown in FIG. 1, a vacuum processing apparatus 200 in the present embodiment includes an atmospheric side block 201 disposed on the front side, and a vacuum side block 202 disposed behind it and connected thereto to transfer, process, and handle the wafer W in its depressurized internal space. In the present embodiment, an atmospheric transfer container 203, a cassette stage 204, and an aligner 205 included in the atmospheric side block 201 are the same as those of the atmospheric side block 101 and their operations are also the same.

In addition, in the vacuum side block 202, a lock chamber 206 connected to a rear face of the atmospheric transfer container 203 and vacuum transfer containers 209, 210, and 211 are connected to each other by intermediate chamber containers 212 and 213, and a configuration in which chamber spaces in these containers are caused to communicate by gates through which the wafer W is transferred to pass is also the same as the configuration in the embodiment shown in FIG. 1.

In the vacuum side block 202 of the present embodiment, the lock chamber 206, gate valves 207 and 208, the vacuum transfer containers 209, 210, and 211, the intermediate chamber containers 212 and 213, and gate valves 220 to 225 have the same configurations as those of counterparts in Embodiment 1. Besides, the gate valves 220 to 225 have configurations substantially equivalent to each other and it is also true for gate valves 230 to 233 and 239 to 242. Further, the same is true of gates opened/closed by these gate valves.

In addition, ashing processing units 215 and 218 have the same configuration as that of the ashing processing unit 114 or 117 in Embodiment 1 and a cooling unit 216 has the same configuration as that of the cooling unit 115 in FIG. 1. Further, bypass containers 226, 227, 243, and 244 have the same configuration as that of the bypass container 126 or 127 in the embodiment shown in FIG. 1.

Furthermore, each of vacuum transfer robots 234, 235, and 236 and robot arms 228 and 229 has the same configuration as that of the vacuum transfer robots 134, 135, and 136 shown in FIG. 1. In the present embodiment, a robot arm is not shown in the bypass containers 243 and 244; however, those having the same configuration as the robot arms 128 and 129 in the embodiment shown in FIG. 1 are disposed in the same way as the bypass containers 226 and 227 so that they are provided with a configuration to transfer the wafer W between processing chambers in two containers connected via the bypass container 243 or 244 through a gate.

The present embodiment differs from the embodiment shown in FIG. 1 in that processing units for conducting etching processing on the wafer W are provided, and the pressure in a processing chamber, which is a condition of the etching processing in the processing chamber for conducting the etching processing, is a prescribed value in the range of 0.05 to 20 Pa. Furthermore, as a condition for ashing processing in the ashing processing units 215 and 218, the pressure in its processing chamber is set equal to a prescribed value in the range of 80 to 120 Pa. Also, as a condition for cooling in the cooling unit 216, the pressure in its processing chamber is set equal to 1,000 Pa. The internal pressure in the bypass containers 226, 227, 243, and 244, the vacuum transfer containers 209 to 211, and the intermediate chamber containers 212 and 213 is set equal to a prescribed value in the range of 20 to 50 Pa.

In the present embodiment, a row of processing units formed by connecting three processing units to containers for transfer disposed between them to connect them is disposed in the drawing on the left side of the row of the containers for transfer formed by connecting the vacuum transfer containers 209 to 211 and the intermediate chamber containers 212 and 213 in the front-and-rear direction. Individual vacuum containers in the processing units are connected to the vacuum transfer containers 209, 210, and 211, respectively.

Gate valves are disposed between containers configuring the processing units and the transfer containers and between containers in the processing units and the vacuum transfer containers so that the processing chambers and the transfer chambers in the containers can be hermetically sealed. Also, the ashing processing unit 215 and the cooling unit 216 respectively have mounting stages 215' and 216' having the identical configurations similar to the embodiment in FIG. 1. Furthermore, rotation axes in the vertical direction of the robot arms 228 and 229 in the bypass container 226 and the bypass container 227 and center positions of the mounting stages 215' and 216' are disposed in zigzags in the left-and-right direction, when viewed from the above, with respect to the front-and-rear direction of the vacuum processing apparatus 200.

In the left row of the processing units, an etching processing unit 214, which conducts etching processing on the wafer W in a processing chamber in its vacuum container, is connected to a left side wall of the vacuum transfer container 209. The vacuum container of the etching processing unit 214 takes a cylindrical shape, and its plane shape is circular when viewed from the above. In addition, the vacuum container is connected to a side wall corresponding to a side of the bypass container 226 having its side walls in a hexagonal plane shape with the gate valve 230 sandwiched in-between and the two containers are caused to communicate with each other by a gate.

On the other hand, in a row of a plurality of processing units disposed on the right side of the row of the vacuum transfer containers 209 to 211, an etching processing unit 217, the ashing processing unit 218, and an etching processing unit 219 from the front are connected and disposed with the bypass containers 243 and 244 between them. The etching processing unit 217 and the etching processing unit 219 have the same configuration as that of the etching processing unit 214 and are disposed to be connected to the right side walls of the vacuum transfer containers 209 and 211, respectively.

The connection of the etching processing unit 217 to the bypass container 243 has the same configuration as the configuration of the connection of the etching processing unit 214 to the bypass container 226. The same is true of the connection of the etching processing unit 219 to the bypass container 244 as well.

In such a configuration, the unprocessed wafer W does not pass through the inside of the space constituted by the vacuum transfer containers 209 to 211 and the intermediate chamber containers 212 and 213 in the present embodiment from the time when it is transferred into the etching processing unit 214 until it is finished with cooling processing applied as being transferred to the cooling unit 216. Similarly, the unprocessed wafer W does not pass through the inside of the space constituted by the vacuum transfer containers 209 to 211 and the intermediate chamber containers 212 and 213 from the time when it is transferred into the etching processing unit 217 or 219 until it is finished with ashing processing in the ashing processing unit 218.

Even in the present embodiment, the space constituted by the vacuum transfer containers 209 to 211 and the intermediate chamber containers 212 and 213 are caused to communicate with each other and constitute a united space, and the gate valves 220 to 225 disposed between the vacuum transfer containers 209 to 211 and the processing units connected to their left and right side walls hermetically seal the space from these processing units. Only the wafer before processings or after processings is transferred through the sealed space and the wafer W in a state in which a processing in the middle of a plurality of processings is finished is not transferred through.

In other words, the wafer W transferred through the above space is a wafer W before processings, or a wafer W after the ashing processing or the cooling processing with particles which stay around the wafer W and cause contamination being reduced.

Incidentally, even in the present embodiment, the gate valves 220 to 225, 230 to 233, and 239 to 242 conduct the opening operation exclusively. Namely, an arbitrary gate valve is opened in the state in which all other gate valves which open/close gates communicating with two containers/processing chambers connected via a gate for which the gate valve is disposed are kept in the blocked state.

Furthermore, in the present embodiment, the wafer W which was subjected to etching processing in a processing chamber in the etching processing unit 214 is transferred from the processing chamber in the etching processing unit 214 to the inside of a processing chamber in the ashing processing unit 215 through a transfer chamber in the bypass container 226. In addition, the wafer W which was subjected to ashing processing in the ashing processing unit 215 is transferred from the ashing processing unit 215 to the cooling unit 216 through the bypass container 227.

At the time of these transfers, pressures in chambers in two containers disposed with one gate valve in-between are first made equal or nearly equal, the gate valve is opened to transfer the wafer W from a chamber in one container to a chamber in the other, and the gate valve is blocked after the transfer. When transferring among three or more containers, transfer is conducted by equalization of the pressures and opening of a gate valve between two successive containers.

In transfer between different processing units or containers, pressure adjustment is conducted in a chamber in each container with the gate valve closed, as described above.

In the present embodiment, in the left row of the processing units between the processing chamber in the ashing processing unit 215 and a storage space in the bypass container 226 and between the processing chamber in the cooling unit 216 and a storage space in the bypass container 227 evacuation paths are shared, respectively, so that common evacuation paths 237 and 238 for respective pairs are provided. These common evacuation paths 237 and 238 are connected to a roughing pump such as a rotary pump in the same way as Embodiment 1; also, each of the common evacuation paths 237 and 238 is branched between the roughing pump and a processing unit or a bypass container and connected to the processing chamber and the storage space; valves are disposed between the branching location and the processing chamber/storage space in order to adjust opening/closing of the path.

On the other hand, an evacuation path for a processing chamber in each of the etching processing units 214, 217, and 219 is disposed and connected to the processing chamber independently, and connected to a vacuum pump capable of achieving a high degree of vacuum such as a turbo molecular pump. In the drawing, only an evacuation path 246 for the etching processing unit 219 is shown.

Moreover, in the right row of the processing units, the two processing units for etching and the processing unit for ashing are disposed in a row in the front-and-rear direction; since the two processing units for etching have independent evacuation paths, a common evacuation path 245 is disposed to evacuate a processing chamber in the ashing processing unit 218 and storage spaces in the bypass containers 243 and 244. This evacuation path 245 is also connected to a roughing pump in the same way as the left row and is branched and connected to the processing chamber in the ashing processing unit 218 and the storage spaces in the bypass containers 243 and 244; valves are disposed on the respective branched paths to adjust opening/closing of the paths.

In such a configuration, a flow of a transfer operation conducted until a wafer W taken out from the cassette and transferred to the lock chamber 206 is transferred into the vacuum transfer container 209 in the vacuum side block 202 is the same as that in the embodiment shown in FIG. 1.

Upon opening of the gate valve 220, the unprocessed wafer W transferred into a vacuum transfer chamber in the vacuum transfer container 209 is transferred into the etching processing unit 214 by the vacuum transfer robot 234. Then, the wafer W is subjected to etching processing, transferred into the processing chamber in the ashing processing unit 215 through the bypass container 226, and subjected to ashing processing.

In addition, the wafer W finished in the ashing processing is not transferred out into the vacuum transfer container, but transferred to the processing chamber in the cooling unit 216 and subjected to cooling processing. When it is detected that cooling of the wafer W for a prescribed time is finished, the gate valve 222 is opened and the wafer W is transferred out from the cooling unit 216 into the vacuum transfer container 211, transferred to the lock chamber 206 through the intermediate chamber container 213, the vacuum transfer container 210, the intermediate chamber container 212, and the vacuum transfer container 209, and returned to the original position in the original cassette in the atmospheric side block 201.

In the left row of the processing units, the path followed from the time when the wafer W is transferred into the etching processing unit 214 until it is transferred into the vacuum transfer container 211 after the cooling in the cooling unit 216 is finished and the paths followed from the time when it is transferred from the lock chamber 206 into the vacuum transfer container 209 until it is transferred into the etching processing unit 214 and followed from the vacuum transfer container 211 until it is transferred into the lock chamber 206 do not overlap or communicate with each other in paths or spaces in containers.

In the processing conducted on the wafer W in the left row described above, the gate valve 221 between the vacuum transfer container 210 and the ashing processing unit 215 is kept closed. In case when the temperature of the wafer W after completion of the processing in the ashing processing unit 215 is low enough to prevent a hindrance to transfer or to prevent great contamination, then after the completion of the processing of the wafer W in the ashing processing unit 215, the wafer W which was subjected to the ashing processing may be transferred into the vacuum transfer container 210 by opening the gate valve 221 after adjustment of pressure without transferring to the cooling unit 216 through the bypass container 227.

Such an example is equivalent to processing in the right row of the processing units. In this case, only the unprocessed wafer W is transferred through a vacuum transfer chamber in the vacuum transfer container 211.

In this case, when the gate valve 221 is blocked, the processing chamber in the ashing processing unit 215 and a vacuum transfer chamber in the vacuum transfer container 210 are hermetically sealed and partitioned. The pressure in the inside of the processing chamber in the ashing processing unit 215 is kept at a prescribed value in the range of 20 to 50 Pa which is a pressure suitable for transfer and the wafer W after the processing is transferred to the lock chamber 206 through the hermetically sealed united space constituted by the vacuum transfer containers 209 to 211 and the intermediate chamber containers 212 and 213.

In the right row of the processing units, the unprocessed wafer W is transferred from the lock chamber 206 through two paths, subjected to processing, and returned to the lock chamber 206. The unprocessed wafer W transferred into the etching processing unit 217 is subjected to etching processing, then transferred into the processing chamber in the ashing processing unit 218 through the bypass container 243, subjected to ashing processing, transferred into the vacuum transfer container 210 after the ashing processing is finished, and returned to the lock chamber 206.

Also, if the etching processing unit 217 is conducting processing on the wafer W or the gate valve 223 is in a state in which it cannot be opened at the time of introduction from the lock chamber 206 into the vacuum side block 202, it is transferred into the etching processing unit 219 through the intermediate chamber container 212, the vacuum transfer container 210, the intermediate chamber container 213, and the vacuum transfer container 211. The unprocessed wafer W transferred into the etching processing unit 219 is subjected to etching processing, then transferred into the processing chamber in the ashing processing unit 218 through the bypass container 244, subjected to ashing processing, transferred into the vacuum transfer container 210 after the ashing processing is finished, and returned to the lock chamber 206.

As described above, also in the flow of processings on the wafer W in the right row of the processing units, the processing path followed from the time when the wafer W is introduced into the etching processing unit 217 until it is transferred out from the ashing processing unit 218 to the vacuum transfer container 210 after being subjected to ashing processing in the ashing processing unit 218 to which it is transferred through the bypass container 243 or followed from the time when the wafer W is introduced into the etching processing unit 219 until it is transferred out from the ashing processing unit 218 to the vacuum transfer container 210 after being subjected to ashing processing in the ashing processing unit 218 to which it is transferred through the bypass container 244, and the transfer path in which only the unprocessed wafer W or the wafer W finished in ashing processing in the ashing processing unit 218 is transferred through the lock chamber 206 and the space constituted by the vacuum transfer containers 209 to 211 and the intermediate chamber containers 212 and 213 do not overlap with each other.

In other words, in the vacuum processing apparatus, the path for conducting a series of processing on the wafer is hermetically partitioned from the path for transferring the wafer W which is not yet subjected to any of the series of processing or which is already subjected to all of the series of processing. Owing to such a configuration, contamination of the wafer W or a surface member inside of the space/chamber constituting the path and occurrence of cross contamination can be suppressed so that the yield of the processing on the wafer W can be improved, or the overall efficiency of the processing can be improved by reducing the time or the frequency of the work for maintenance and inspection of the apparatus.

By preventing overlap between a first path for transferring the wafer before processing and the wafer after processing and a second path for transferring between processing chambers via bypass chambers, it becomes possible to suppress and avoid cross contamination of the wafer before processing and the interior of the transfer path.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus comprising:
a container of an atmospheric transfer chamber having a plurality of cassette stages disposed on a front side thereof, a cassette storing wafers to be processed being mounted on each of the cassette stages, a wafer being transferred within the container of the atmospheric transfer chamber;
a lock chamber disposed behind the atmospheric transfer chamber;
a row of containers of vacuum transfer chambers connected to each other behind the lock chamber, the wafer being transferred through a depressurized inside of the row of the containers of the vacuum transfer chambers;
an intermediate chamber disposed between the containers of the vacuum transfer chambers, and coupled thereto, the wafer being mounted and stored therein;
a first and second processing unit each of which comprises a processing chamber connected to left or right side walls of each of the containers on the row of containers of the vacuum transfer chambers, the wafer before processing being transferred into the first processing unit from the lock chamber through one of the vacuum transfer chambers along a going path for being processed in the first processing unit and being transferred out of the second processing unit after being processed therein into another one of the vacuum transfer chambers and returned to the lock chamber along a returning path;
a bypass chamber disposed between a first processing unit and a second processing unit of the plurality of processing units and coupled thereto, the bypass chamber constituting a bypass path which is another transfer path for transferring the wafer from the first processing unit to the second processing unit and the bypass chamber comprising therein a robot which transfers the wafer along the bypass path via the bypass chamber; and
a control unit which is configured to control transfer of the wafer so that the wafer before processing is transferred from the lock chamber into the first processing unit through the one of the vacuum transfer chambers along the going path, the wafer is transferred from the first processing unit after being processed therein to the second processing unit along the bypass path, and the wafer is transferred from the second processing unit after completion of processing therein into the another one of the vacuum transfer chambers and returned to the lock chamber via the one of the vacuum transfer chambers along the returning path.

2. A vacuum processing apparatus comprising:
a container of an atmospheric transfer chamber having a plurality of cassette stages disposed on a front side thereof, a cassette storing wafers to be processed being mounted on each of the cassette stages, a wafer being transferred within the container of the atmospheric transfer chamber;
a lock chamber disposed behind the atmospheric transfer chamber;
a row of containers of vacuum transfer chambers connected to each other behind the lock chamber, one of the containers of vacuum transfer chambers is coupled to the lock chamber, the wafer being transferred through a depressurized inside of the row of the containers of the vacuum transfer chambers;
an intermediate chamber disposed between the containers of the vacuum transfer chambers and coupled thereto, the wafer being mounted and stored therein;
a plurality of processing units each of which comprises a processing chamber and connected to left or right side walls of each of the containers of the row of containers of vacuum transfer chambers, the wafer being processed in the processing chambers;
a bypass chamber disposed between a first processing unit and a second processing unit of the plurality of processing units coupled thereto which constitutes a bypass path connecting the first and second processing units, the bypass chamber comprising therein a robot which transfers the wafer along the bypass path via the bypass chamber;

wherein a first space constituted by a first and second processing unit of the plurality of the processing units and the bypass chamber which couples the first and second processing units, and a second space constituted by the vacuum transfer chambers and the intermediate chamber which connects the vacuum transfer chambers are configured to be hermetically partitioned from each other, wherein the first space includes a bypass path for transferring the wafer from the first processing unit to the second processing unit, and the second space includes a going path for transferring the wafer before processing from the lock chamber to the first processing unit through the one of the vacuum transfer chambers and a returning path for transferring the wafer out of the second processing unit after being processed therein to the another one of the vacuum processing chambers and returning the wafer to the lock chamber; and a control unit which is configured to control the transfer of the wafer so that the wafer before processing is transferred from the lock chamber into the second space along the going path and then into the first processing unit, the wafer is transferred into the second processing unit along the bypass path in the first space after being subject to processing in the first processing unit, the wafer is transferred into the second space after completion of processing in the second processing unit, and the wafer is returned to the lock chamber along the returning path through the second space.

* * * * *